US006731550B2

(12) United States Patent
McClure

(10) Patent No.: US 6,731,550 B2
(45) Date of Patent: May 4, 2004

(54) REDUNDANCY CIRCUIT AND METHOD FOR SEMICONDUCTOR MEMORY DEVICES

(75) Inventor: David C. McClure, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/161,501

(22) Filed: May 31, 2002

(65) Prior Publication Data

US 2003/0223282 A1 Dec. 4, 2003

(51) Int. Cl.[7] ................................................. G11C 7/00
(52) U.S. Cl. .............. 365/200; 365/185.09; 365/230.06
(58) Field of Search ........................... 365/200, 230.06, 365/230.02, 230.03, 185.09, 185.08

(56) References Cited

U.S. PATENT DOCUMENTS 5,179,536 A * 1/1993 Kasa et al. ................. 365/200
5,959,906 A * 9/1999 Song et al. ................. 365/200
6,314,032 B2 * 11/2001 Takase ....................... 365/200
6,490,210 B2 * 12/2002 Takase et al. ............... 365/201
6,542,420 B2 * 4/2003 Takase ....................... 365/200
6,563,759 B2 * 5/2003 Yahata et al. ............... 365/233

* cited by examiner

Primary Examiner—Gene Auduong
(74) Attorney, Agent, or Firm—Lisa K. Jorgenson; Andre Szuwalski

(57) ABSTRACT

A redundancy circuit and method are disclosed for replacing at least one defective memory cell in a memory device. The redundancy circuit may include redundant decode circuitry for selectively maintaining an address of a defective memory cell in the memory device, receiving the input address and generating an output signal having a value indicative of whether the input address corresponds to the address of the defective memory cell. The redundancy circuit may further include a plurality of redundant storage circuits for selectively maintaining data values, and redundant control circuitry for selectively and individually accessing a first of the redundant storage circuits based upon the value of the output signal of the redundant decode circuitry.

35 Claims, 5 Drawing Sheets

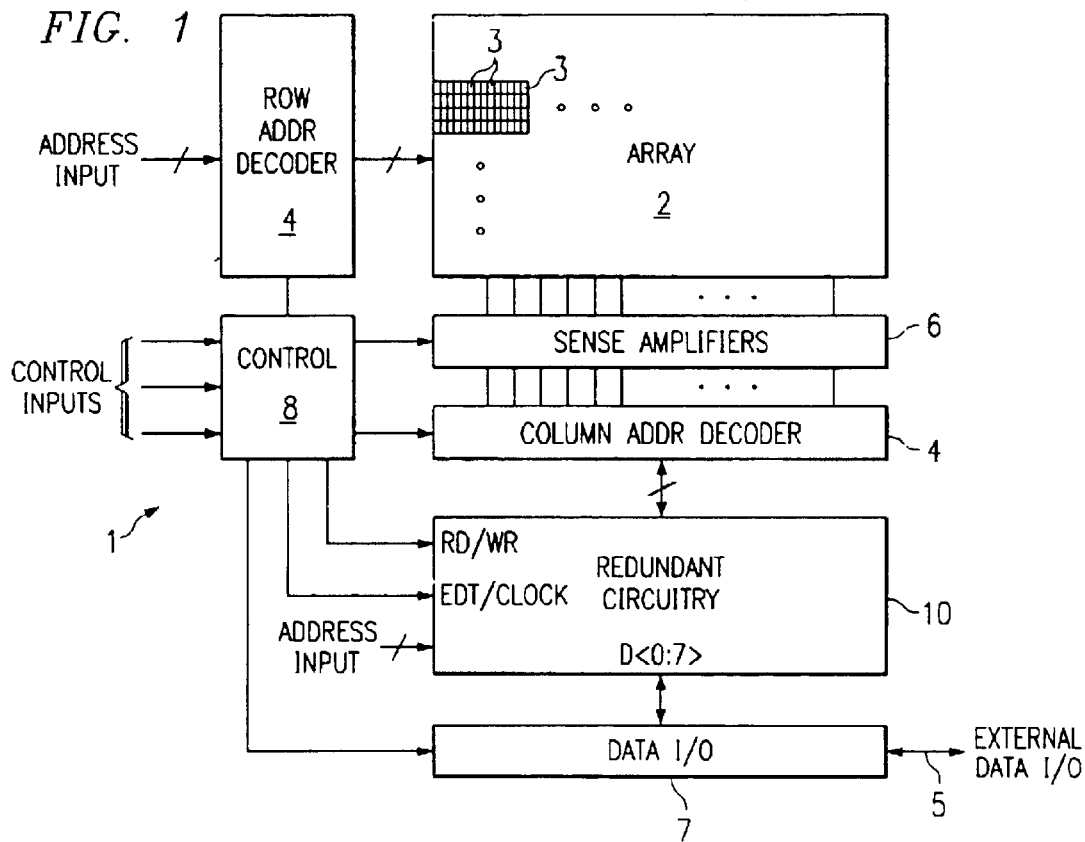
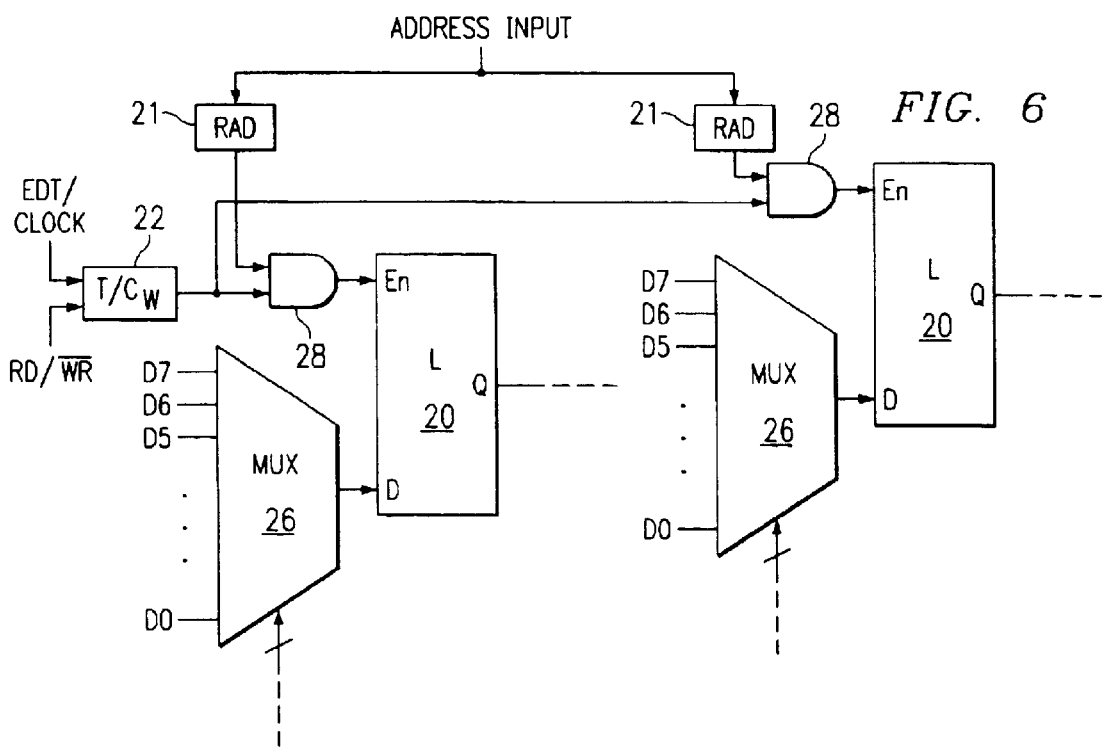

REDUNDANCY CIRCUIT AND METHOD FOR SEMICONDUCTOR MEMORY DEVICES

BACKGROUND OF THE INVENTION

1. Technical Field of the Invention

The present invention relates to redundant circuitry for memory devices, and particularly to a redundancy scheme in which defective memory cells are individually replaced.

2. Description of the Related Art

Processing defects in memory devices, such as static random access memory (SRAM) devices and dynamic random access memory (DRAM) devices, can significantly reduce the processing yield in large scale memory arrays. In order to improve the processing yield of memory chips, various methods of error correction have been created. These include 'soft' error correcting whereby software corrects for physical defects, and 'hard' error correcting whereby defective circuit elements are replaced with redundant elements included on the chip. The use of soft or hard error correcting can result in lower chip manufacturing costs and earlier introduction of new products on existing wafer fabrication lines or in new process technologies.

Yield enhancement by 'hard' error correcting on a memory chip is typically produced by including redundant rows and/or columns within the memory array. A few redundant rows or columns can significantly enhance yield of a memory circuit since many devices are rejected for single bit failure or failures in a single row or column. These redundant rows or columns can be added to the memory design to replace defective rows or columns which are identified at electrical test after wafer processing.

To replace a defective memory row or column, the defective row or column is first disconnected from the array. This is accomplished by one of three methods: current blown fuses, laser blown fuses, and laser annealed resistor connections. Then a redundant row or column is enabled and programmed with the defective row or column address.

Although this use of redundant rows and columns of memory cells increases product yield, many times the dominant failures in a memory device are isolated in nature and primarily cause individual memory cells to fail. Without entire rows or columns of memory cells failing, most of the redundant memory cells appearing in existing memory devices are unused, resulting in wasted silicon space in the memory device.

Based upon the foregoing, there is a need for a redundancy technique for memory device that more efficiently remedies a majority of failing memory devices.

SUMMARY OF THE INVENTION

Embodiments of the present invention overcome shortcomings associated with existing redundancy techniques and satisfy a significant need for a more efficient way to replace defective memory cells in a semiconductor memory device. Defective memory cells are individually replaced. Instead of providing entire rows and/or columns of redundant memory cells, only a limited number of redundant storage elements are needed in the memory device in order to suitably replace isolated memory cells that are defective.

According to an exemplary embodiment of the present invention, a memory device includes at least one redundant storage circuit capable of storing a data value, and redundant decode circuitry for selectively maintaining an address of a defective memory cell in the memory device and generating an output signal having a value indicative of an input address corresponding to the address of the defective memory cell. The memory device further includes circuitry for individually replacing the defective memory cell with the redundant storage circuit during a memory access operation based upon the value of the output signal of the redundant decode circuitry. By individually replacing the defective memory cell with a single redundant storage circuit, the memory device is capable of efficiently handling isolated defects occurring within the array of memory cells in the memory device.

An operation of the memory device includes receiving an address input during a memory access operation, determining whether the address input corresponds to a defective memory cell, identifying the individual external data signal to connect to the redundant storage circuit, and individually connecting the identified external data signal to the redundant storage circuit.

BRIEF DESCRIPTION OF THE DRAWINGS

A more complete understanding of the system and method of the present invention may be obtained by reference to the following Detailed Description when taken in conjunction with the accompanying Drawings wherein:

FIG. 1 is a block diagram of a memory device according to an exemplary embodiment of the present invention;

FIG. 6 is a block diagram of a portion of the redundancy circuitry of FIG. 1 according to an exemplary embodiment of the present invention.

DETAILED DESCRIPTION OF THE EXEMPLARY EMBODIMENTS

Figure 2:
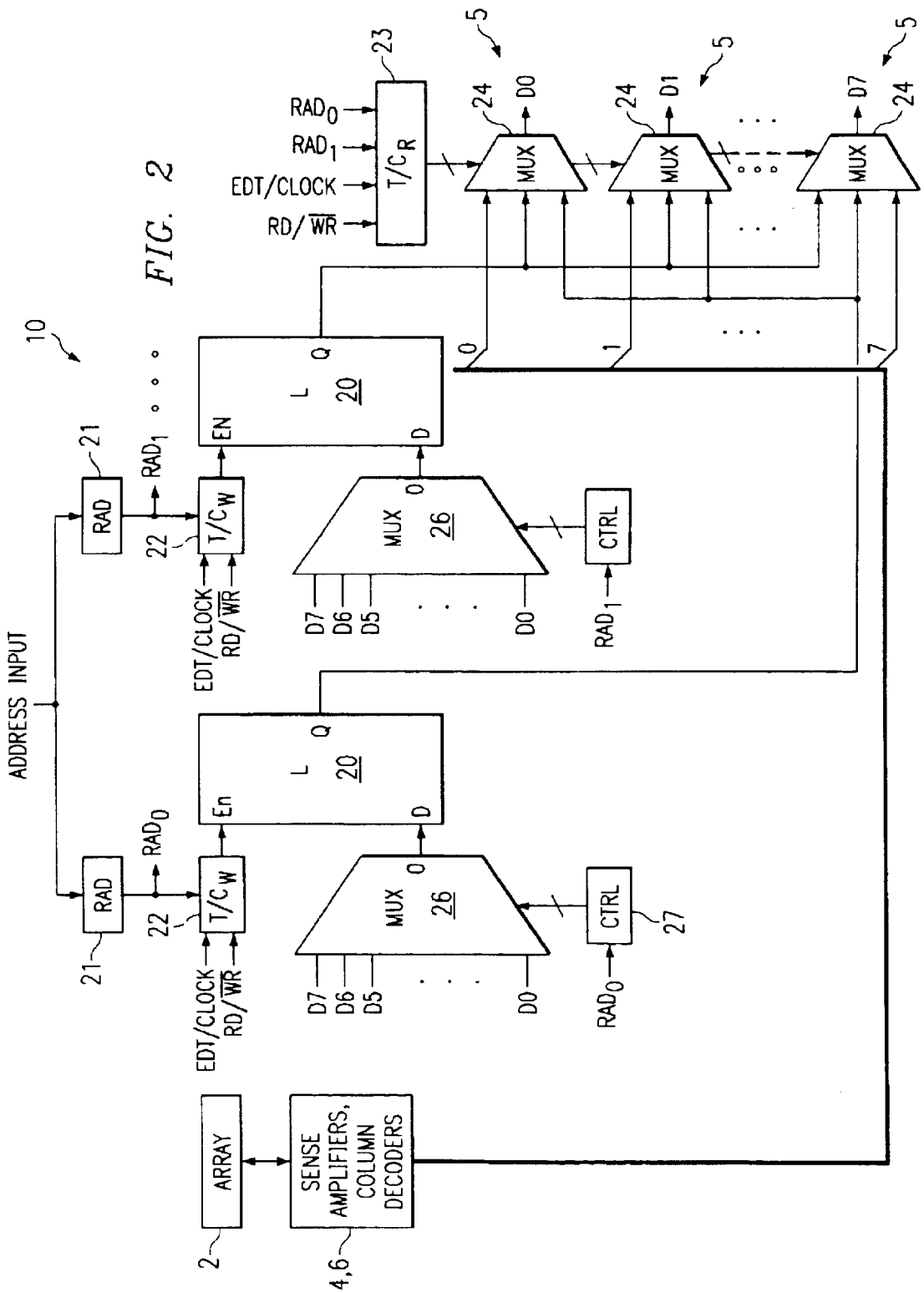
FIG. 2 is a block diagram of redundancy circuitry of the memory device of FIG. 1 in accordance with an exemplary embodiment of the present invention.

The present invention will now be described more fully hereinafter with reference to the accompanying drawings in which exemplary embodiments of the invention are shown. This invention may, however, be embodied in many different forms and should not be construed as being limited to the embodiments set forth herein. Rather, the embodiments are provided so that this disclosure will be thorough and complete, and will fully convey the scope of the invention to those skilled in the art.

Referring to FIG. 1, there is shown a memory device 1 according to an exemplary embodiment of the present invention. Memory device 1 may be a volatile memory device, such as a static or dynamic random access memory, or a non-volatile memory device, such as a flash memory or a ferroelectric memory. For exemplary purposes only, memory device 1 will be described below as a static random access memory (SRAM). Further, memory device 1 may be a stand-alone memory chip or embedded in an integrated circuit chip, such as an application specific integrated circuit (ASIC).

Memory device 1 may include an array 2 of memory cells 3. Memory cells 3 may be arranged into rows and columns, with each row of memory cells 3 being connected to a distinct word line (not shown) and each column of memory cells 3 being connected to a distinct bit line (not shown). As discussed above, memory cells 3 may be static or dynamic random access memory cells, flash memory cells, ferroelectric memory cells or memory cells of other types.

Memory device 1 may include address decode circuitry 4 which receives an address input during the course of a memory access operation, and selects one or more memory cells based upon the value of the address input. In particular, the address decode circuitry may drive a word line to a voltage level to connect a row of memory cells to the bit lines, and couple one or more of the bit lines to one or more external data signals/ports 5. Memory device 1 may further include sense amplifiers 6 which sense the voltage levels appearing on the bit lines and drive the bit lines to voltage levels corresponding to logic high and logic low values. Input/output circuitry 7 may couple selected bit lines to external data signals 5. A control circuit 8 may generate control and timing signals to effectuate memory access operations. The general operation of memory cells 3, address decode circuitry 4, input/output circuitry 7 and control circuitry 8 is known and will not be described in detail for reasons of simplicity.

In accordance with an exemplary embodiment of the present invention, memory device 1 may include redundancy circuitry 10 which is capable of individually replacing memory cells 3 that are determined to be defective. In this way, memory device 1 may efficiently overcome isolated defects in array 2 that adversely affect the operation of individual memory cells 3.

FIG. 2 illustrates a block diagram of redundancy circuitry 10 according to an exemplary embodiment of the present invention. Redundancy circuitry 10 may include one or more storage circuits 20. Each storage circuit 20 may be capable of storing a data value and serves as a redundant storage element for replacing a defective memory cell in array 2. The particular implementation of storage circuits 20 may vary depending upon the type of memory cells in array 2 that storage circuits 20 replace. For instance, storage circuits 20 may be implemented as latch circuits in the event memory device 1 is a volatile memory device. Alternatively, storage circuits 20 may be implemented with non-volatile components, such as floating gate transistors, in the event memory device 1 is a non-volatile memory.

Redundancy circuitry 10 may include one or more redundant address detection circuits 21, with each redundant address detection circuit being associated with a distinct storage circuit 20. In general terms, redundant address detection circuit 21 may be programmable to store an address value of a defective memory cell 3 in array 2. Redundant address detection circuit 21 may receive the address input provided to memory device 1 and compare the address input received with the programmed address value to determine whether the memory cell corresponding to the programmed address value is to be accessed in an ongoing memory access operation. In the event redundant address detection circuit 21 determines that the address input is the same as or otherwise corresponds to the programmed address value, an output signal is generated having a value indicating that the storage circuit 20 associated with the redundant address detection circuit 21 is to be used to replace the defective memory cell 3.

Figure 3:
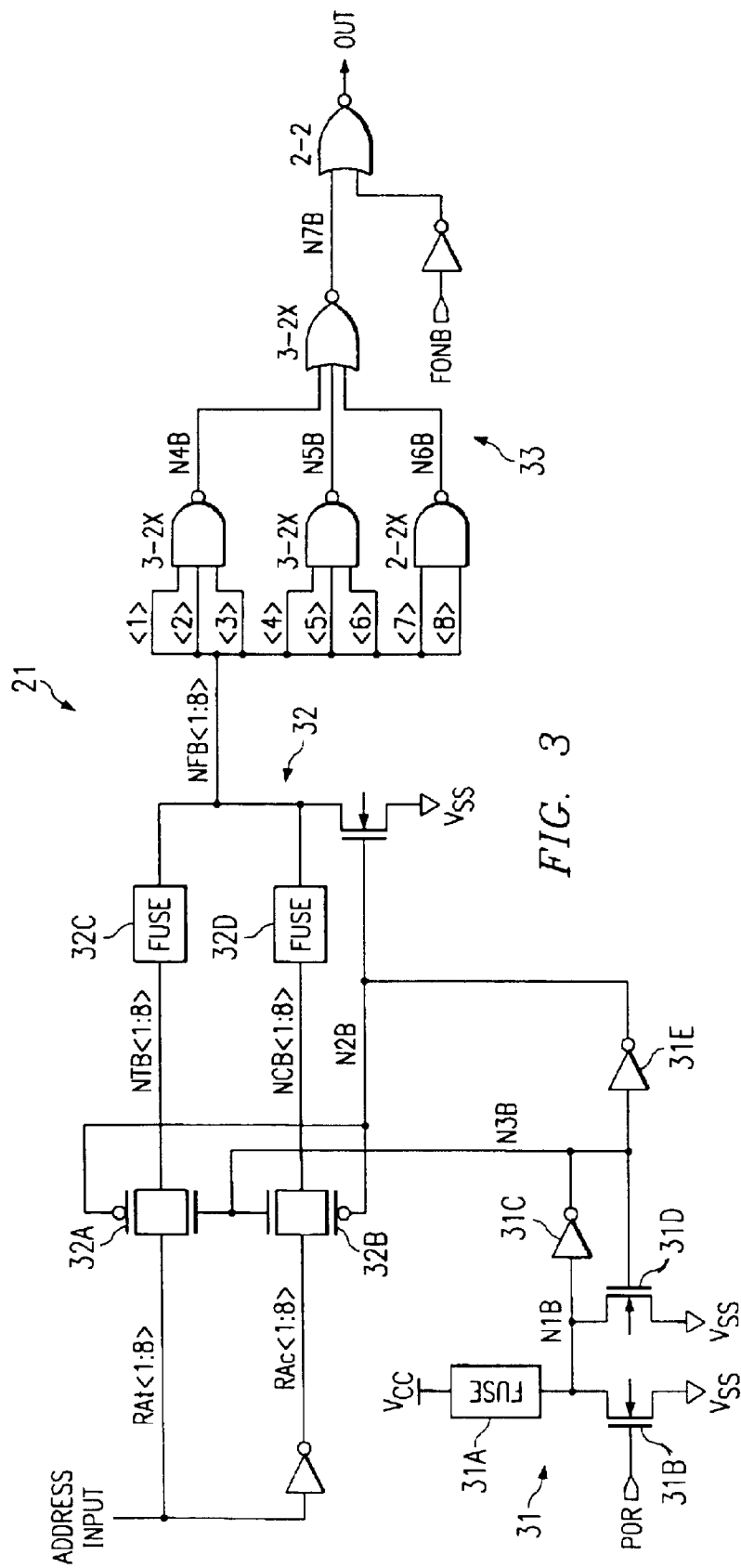
FIG. 3 is a schematic of the redundant address detection circuit of FIG. 2.

FIG. 3 is a schematic diagram of redundant address detection circuit 21 according to an exemplary embodiment of the present invention. The particular implementation includes the ability to program redundant address detection circuit 21, based upon the address of a defective memory cell 3, so as to selectively pass either the logical true or logical complement of each bit of the address input to a decoder, the output of which determines whether the address input matches the address of the defective memory cell 3. Redundant address detection circuit 21 may include programmable circuitry 30 which configures redundant address detection circuit 21 based upon the address of a defective memory cell 3. Programmable circuitry 30 may include fuse elements which are selectively blown so as to provide programmable functionality. It is understood, however, that other programmable elements may be used instead of fuse elements to provide programmable functionality.

Redundant address detection circuit 21 may include an enable circuit 31 for enabling and/or allowing redundant address detection circuit 21 to generate an output signal indicative of whether the address input matches the address of a defective memory cell 3 to which redundant address detection circuit 21 is programmed. Enable circuit 31 may include a fuse 31A and a first transistor 31B coupled thereto between a supply voltage Vcc and a ground potential. A power-on-reset signal POR, which may temporarily pulse to a logic high state during the time memory device 1 is powered up, may be connected to a gate/control terminal of first transistor 31B so as to temporarily activate first transistor 31B. A latch element formed by logic inverter 31C and second transistor 31D may maintain node N1B at a logic low voltage level in the event fuse 31A is blown and following the first transistor 31B being temporarily activated. Otherwise, in the event that fuse 31A is not blown, fuse 31A may maintain node N1B at logic high voltage levels even when first transistor 31B is temporarily activated, such that second transistor 31D remains turned off. Enable circuit 31 generates signal N3B from the output of logic inverter 31C and signal N2B from the output of logic inverter 31E, which itself is coupled to receive signal N3B at the input thereof.

Programmable circuitry 32 may, as described above, pass to a decoder 33 either the logical true (seen in FIG. 3 as RAT<1:8>) or logical complement (RAC<1:8>) of each bit of the address input based upon the programmed address of a defective memory cell 3. Programmable circuitry 30 may include pass gate transistors 32A and 32B which, when activated, pass each bit of the logical true address input RAT and the logical complement address input RAC, respectively, towards decoder 33. Pass gate transistors 32A and 32B may be activated by enable circuit 31, i.e., when signal N3B is asserted and signal N2B (the logical complement of signal N3B) is de-asserted.

Programmable circuitry 30 may further include fuse elements 32C and 32D which are coupled between pass gate transistors 32A and decoder 33 and between pass gate transistors 32B and decoder 33, respectively. Each pass gate transistor 32A (32B) may have a distinct fuse element 32C (32D) coupled thereto. For each address input bit, fuse element 32C may be connected to fuse element 32D at the input of decoder 33. Fuse elements 32C and 32D may be selectively blown so as to create an open circuit. In this way, for each address input bit, either the logical true address input RAT or the logical complement address input RAC may be passed to decoder 33. For any bit of the address input, the corresponding logical true address input RAT may be passed to decoder 33 by blowing the fuse element 32C coupled to the logical true address input RAT. Likewise, the logical complement address input RAC corresponding to a bit of the address input may be passed to decoder 33 by blowing the fuse element 32D coupled to the logical complement of the address input RAC.

Decoder 33 may perform a decoding operation to determine whether the input bits of decoder 33 are all in the same state. In this case, decoder 33 will de-assert an output signal OUT when each input bit of decoder 33 is in the logical high state. Each input bit of decoder 33 is coupled to both the corresponding logical true address input RAT (via fuse element 32C) and logical complement address input RAC (via fuse element 32D). By blowing one of fuse element 32C and 32D for each address input bit, redundant address detection circuit 21 is capable of being programmed so as to identify when the value of the address input matches a predetermined address value corresponding to the address of a defective memory cell 3.

It is understood that redundant address detection circuit 21 may have other implementations and provide the function described above.

Redundancy circuitry 10 of FIG. 2 may allow for accessing a storage circuit 20 using substantially the same timing for accessing a memory cell 3. In particular, redundancy circuitry 10 may include a write timing/control circuit 22 for writing data into a storage circuit 20, and a read timing/control circuit 23 for reading data stored in a storage circuit 20. As shown in FIG. 2, a write timing/control circuit 22 may be used to provide the desired timing/control for writing data into a single storage circuit 20. In addition, a single read timing/control circuit 23 may be used to provide the desired timing/control for reading data from any storage circuit 20.

It is understood that a single write timing/control circuit 22 may be used to provide the desired timing and control for accessing a plurality of storage circuits 20. FIG. 6 shows a portion of redundancy circuitry 10 in which a single write timing/control circuit 22 is employed for a number of storage circuits 20. In this implementation, the output of timing/control circuit 22 and the output of each redundant address detection circuit 21 are provided to logical AND gates 28, the outputs of which form the enable/clock input of for storage circuits 20.

According to an exemplary embodiment of the present invention, the redundant address detection circuit 21 of FIG. 2 may be such that any storage circuit 20 may selectively replace any memory cell 3. Consequently, each storage circuit 20 may be coupled to each external data signal 5. For each external data signal 5, the output of each storage circuit 20 may be coupled thereto via a multiplexer circuit 24. Multiplexer circuit 24 may receive as data inputs the output of each storage circuit 20 and an output from array 2 (sense amplifiers 6 and address decode circuitry 4). Each multiplexer circuit 24 may be controlled by read timing/control circuit 23 to pass to external data signals 5 an output of any storage circuit 20 and output signals from array 2. Read timing/control circuit 23 may receive the output of the redundant address detection circuits 21 and generate one or more output signals that serve as the input control signals for multiplexer circuits 24. Read timing/control circuit 23 may determine, based in part upon the output signal of each of the redundant address detection circuits 21, which if any external data signal 5 is to be driven by a storage circuit 20. The portion of read timing/control circuit 23 utilized for this determining may be implemented with combinational logic circuitry, for example.

In order for any storage circuit 20 to be capable of replacing any memory cell 3 having a defect, the input of each storage circuit 20 may be coupled to each external data signal 5. Accordingly, redundancy circuitry 10 may include a plurality of multiplexer circuits 26, each of which having data inputs coupled to each external data signal 5 and a data output coupled to the data input of a distinct storage circuit 20. Each multiplexer circuit 26 may be controlled by a distinct control circuit 27 to pass any external data signal 5 to the storage circuit 20 coupled to the multiplexer circuit 26. Each control circuit 27 may receive the output of the redundant address detection circuit 21 associated with the storage circuit 20 and generate one or more output signals that serve as the input control signals for the multiplexer circuit 26 to which the control circuit 27 is coupled. Each control circuit 27 may determine, based in part upon the output signal of the corresponding redundant address detection circuit 21, which if any external data signal 5 is to be stored in the corresponding storage circuit 20. Control circuits 27 may be implemented with combinational logic circuitry.

Figure 4:
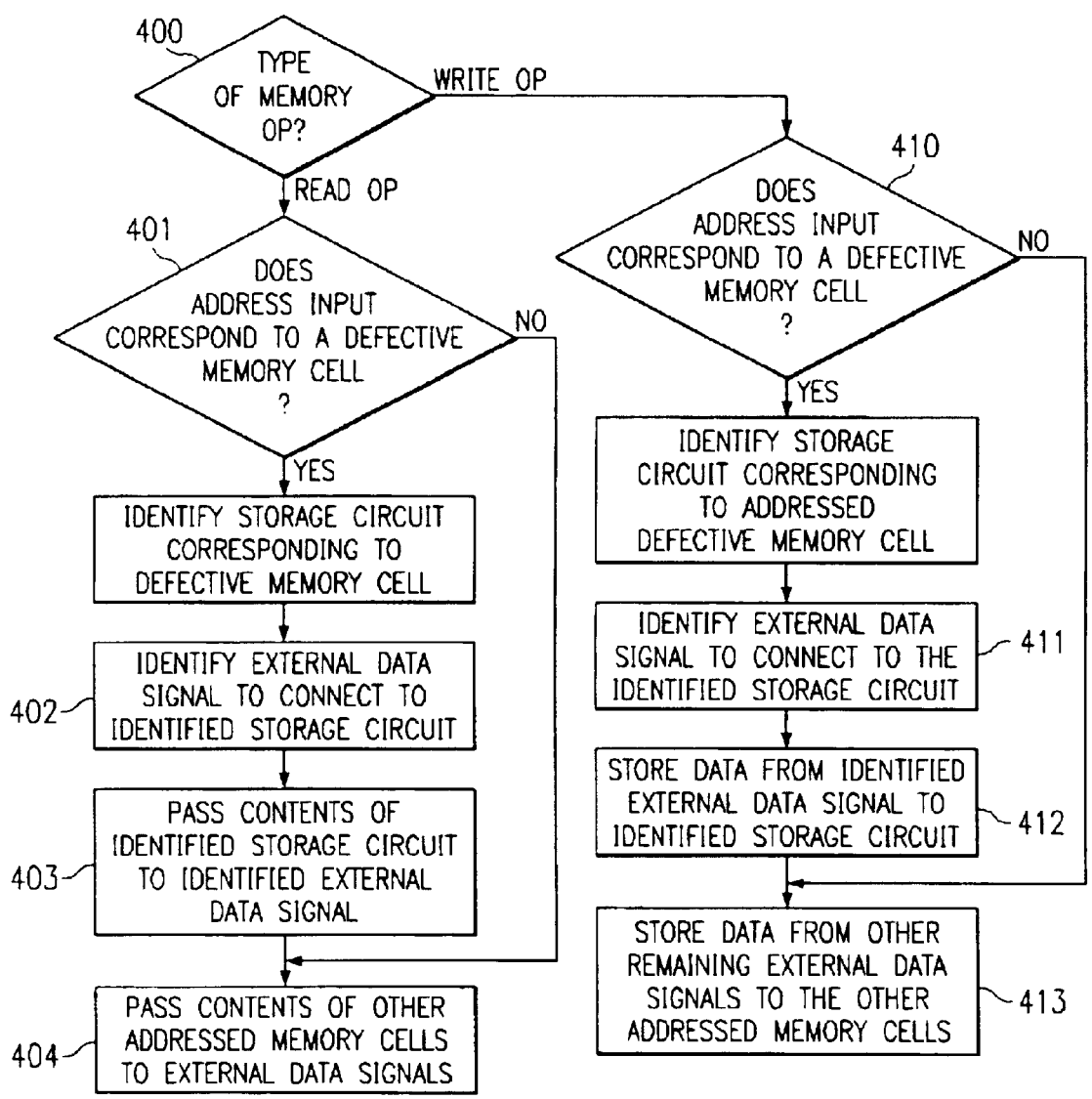
FIG. 4 is a flow chart illustrating an operation of the memory device of FIG. 1.

The operation of memory device 1, and particularly redundancy circuitry 10, will be described with reference to FIG. 4. Upon initiation of a memory access operation, memory device 1 determines at 400 whether a memory read operation or a memory write operation is to be executed. This determination may be performed by control circuit 8 based upon the value of various control input signals applied to memory device 1. In the event a memory read operation is to be executed, memory device 1 determines at 401 whether the addressed memory cells 3, i.e., the memory cells 3 corresponding to the address input, include a defective memory cell 3, and identifies the particular storage circuit 20 that replaces the addressed defective memory cell 3. This step is performed by the redundant address detection circuits 21. In the event the addressed memory cells 3 include a defective memory cell 3, the read timing/control circuit 23 identifies at 402 the particular external data signal 5 to which the contents of the identified storage circuit 20 (which replaces the addressed defective memory cell 3) is to be passed. Read timing/control circuit 23 performs this identification based upon the output of each redundant address detection circuit 21. Next, the contents of the identified storage circuit 20 are passed at 403 to the identified external data signal 5 using multiplexer circuits 24. At substantially the same time as the contents of the identified storage circuit 20 is passed to the identified external data signal 5 at 404, the contents of the remaining addressed memory cells 3, i.e., the addressed memory cells 3 that are not defective, are passed to the remaining external data signals 5, thereby completing the memory read operation.

In the event the memory access operation is a memory write operation, memory device 1 determines at 410 whether the addressed memory cells 3 include a defective memory cell 3. This step is performed in part by redundant address detection circuits 21 generating output signals as described above. This step also identifies the particular storage circuit 20, if any, that is to replace the addressed defective memory cell 3. In the event the addressed memory cells 3 include a defective memory cell 3 (one of the redundant address detection circuits 21 generating an output signal being at a logic low level), the control circuits 27 identify at 411 the particular external data signal 5 that is to be coupled to the identified storage circuit 20. This step may be performed by control circuits 27 based upon the output signals generated by redundant address detection circuits 21. Next, the identified external data signal 5 is stored in the identified storage circuit 20 at step 412. At substantially the same time, the remaining external data signals 5 (i.e., the external data signals 5 other than the identified external data signal) are stored in the remaining addressed memory cells 3 (i.e., the addressed memory cells 3 other than the identified defective memory cell) at 413. Steps 412 and 413 are performed in part by control circuit 8 applying the necessary control signals to various components in memory device 1, including write timing/control circuit 22. At this point, the write operation is complete.

Figure 5:
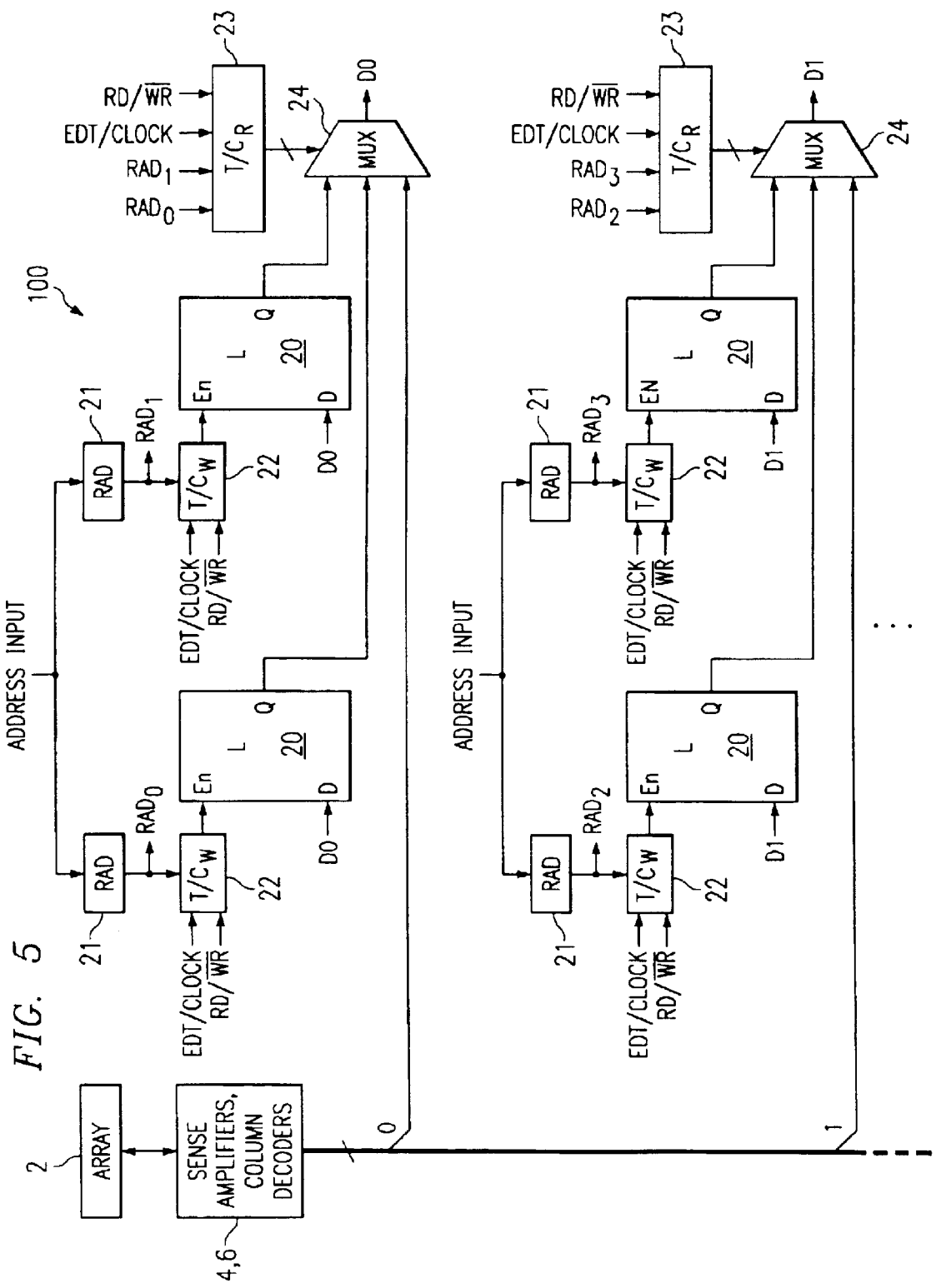
FIG. 5 is a block diagram of redundancy circuitry of the memory device of FIG. 1 in accordance with an exemplary embodiment of the present invention.

Referring to FIG. 5, there is shown a redundancy circuit 100 according to another exemplary embodiment of the present invention. As can be seen, redundancy circuit 100 may include much of the same circuits employed in redundancy circuit 10 of FIG. 2. However, whereas redundancy circuit 10 of FIG. 2 allows any storage circuit 20 to be capable of replacing any memory cell 3 and being coupled to any external data signal 5, storage circuits 20 of the redundancy circuit 100 of FIG. 5 are assigned to replace certain (columns of) memory cells 3 and/or assigned to certain external data signals 5.

In particular, each external data signal 5 may be coupled to a distinct set of one or more storage circuits 20 (and corresponding timing/control circuitry). A storage circuit 20 and corresponding redundant address detection circuit 21 may be coupled to a single external data signal 5. In order to provide the contents of a storage circuit 20 to the single external data signal 5, such as during a memory read operation, the output of storage circuit 20 may be coupled to the external data signal 5 via a multiplexer circuit 24 and read timing/control circuit 23. In order to effectuate a memory write operation to a defective memory cell 3, the external data signal 5 may be coupled to the input of the corresponding storage circuit(s) 20. It is understood that more than one storage circuit 20 may be coupled to a single external data signal 5, as shown in FIG. 5.

Figure 7:
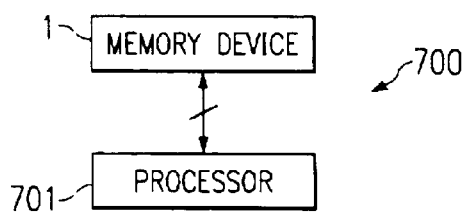
FIG. 7 is a block diagram of a computing device having therein the memory device of FIG. 1.

It is understood that memory device 1 may be utilized in any of a number of devices requiring nonvolatile memory. For instance, memory device 1 may be located in an electronics system 700 (FIG. 7) having a processing unit 701 that accesses information stored in memory device 1. System 700 may be, for example, a computer and/or data processing device, or a telecommunications device, such as a wireless telephone.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A memory device, comprising:
    an array of memory cells, each memory cell being capable of maintaining a data value therein;
    address decode circuitry for receiving an input address and selecting a plurality of memory cells based upon the value of the input address;
    redundant decode circuitry for selectively maintaining an address of defective memory cells in the array, receiving the input address and generating an output signal having a value indicative of whether the input address corresponds to the address of a defective memory cell,
    a plurality of redundant storage cells, each for selectively maintaining data values;
    redundant control circuitry for selectively and individually accessing a first of the redundant storage cells based upon the value of the output signal of the redundant decode circuitry to replace the defective memory cell in the addressed plurality of memory cells.

2. The memory device of claim 1, wherein delays related to accessing the first redundant storage cell are substantially the same as delays related to accessing the array of memory cells.

3. The memory device of claim 1, wherein the memory device is a volatile memory device and the redundant storage cells are latch circuits.

4. The memory device of claim 3, wherein the array of memory cells is a static random access memory device.

5. The memory device of claim 1, wherein the array of memory cells is a non-volatile memory device and the redundant storage cells are circuits capable of storing a data value in a non-volatile manner.

6. The memory device of claim 1, wherein:
    the memory device includes an external data port and the memory device further comprises a multiplexer circuit disposed between the first redundant storage cell and the external data port.

7. The memory device of claim 6, wherein the external data port of the memory device is capable of outputting data values stored in the addressed memory cells, except for the defective memory cell, along with the data value stored in the first redundant storage cell of the memory device.

8. The memory device of claim 1, wherein:
    the memory device includes an external data port and the memory device further comprises a multiplexer circuit disposed between an input of the first redundant storage cell and the external data port.

9. The memory device of claim 1, further comprising:
    a plurality of external data ports; and
    first circuitry for selectively coupling the first redundant storage cell to any of the external data ports.

10. The memory device of claim 1, further comprising:
    the redundant decode circuitry selectively maintaining an address of a second defective memory cell in the array, receiving the input address and generating an output signal having a value indicative of the input address corresponding to the address of the second defective memory cell; and
    wherein a second of the redundant storage cells is coupled to the redundant control circuitry which selectively and individually accesses the second redundant storage cell based upon the value of the output signal of the second redundant decode circuitry to replace the second defective memory cell in the addressed plurality of memory cells.

11. The memory device of claim 10, wherein the memory device includes a plurality of external data ports, and each of the first and second redundant storage cells are coupled to a distinct external data port.

12. The memory device of claim 10, wherein the memory device includes an external data port, the memory device further includes a multiplexer circuit coupled between the first and second redundant storage cells and the external data port.

13. The memory device of claim 1, wherein the redundant storage cells are not located in the array of memory cells.

14. A method of performing a memory access operation in a memory device having an array of memory cells and at least one redundant storage cell, comprising:
    receiving an input address signal;
    comparing the input address signal with an address of defective memory cells in the memory device; and
    upon an affirmative determination that the input address signal corresponds to the address of a defective memory cell, individually accessing the redundant storage cell, along with non-defective ones of the addressed memory cells, to replace the defective memory cell, the step of accessing occurring with substantially the same timing as to both the non-defective memory cells and the redundant storage cell.

15. The method of claim 14, wherein the step of accessing the redundant storage cell comprises coupling an output of the redundant storage cell to an external data port of the memory device.

16. The method of claim 14, wherein the step of accessing the redundant storage cell comprises coupling an input of the redundant storage cell to an external data port of the memory device.

17. The method of claim 14, wherein the step of accessing further comprises latching a data value provided to the memory device into the redundant storage cell.

18. A computing apparatus, comprising:
a processing element; and
a memory device coupled to the processing element for storing information, comprising:
a plurality of memory cells, the memory cells including a defective memory cell;
decode circuitry for receiving an address input provided to the memory device and selecting a plurality of memory cells, including both non-defective memory cells and the defective memory cell, based upon the address input received;
a redundant storage cell capable of maintaining a data value;
redundant detection circuitry for comparing the address input with an address of the defective memory cell;
an external data port; and
circuitry coupled to the redundant storage cell for selectively and individually accessing the redundant storage cell based upon the comparison to replace the defective memory cell along with accessing the addressed non-defective memory cells.

19. The computing apparatus of claim 18, wherein the plurality of memory cells are a volatile memory device and the redundant storage cell is a latch circuit.

20. The computing apparatus of claim 18, wherein the redundant storage cell includes at least one logic gate.

21. The computing apparatus of claim 18, wherein the circuitry comprises a multiplexer circuit coupled between the redundant storage cell and the external data port and between the memory cells and the external data port.

22. The computing apparatus of claim 18, further comprising:
second redundant detection circuitry for comparing the address input with a second address corresponding to a second defective memory cell in the plurality of memory cells; and
a second redundant storage cell capable of maintaining a data value, wherein the circuitry selectively and individually accesses the second redundant storage cell based upon the comparison by the second redundant detection circuitry to replace the second defective memory cell along with accessing the addressed non-defective memory cells.

23. The computing apparatus of claim 22, wherein the memory device includes first and second external data ports, and the redundant storage cell is coupled to the first external data port and the second redundant storage cell is coupled to the second external data port.

24. The computing apparatus of claim 22, wherein the data circuitry includes a multiplexer coupled between the redundant storage cell and the external data port and between the second redundant storage cell and the external data port.

25. The computing apparatus of claim 18, wherein the memory cells are arranged in an array, and the redundant storage cell is spaced from the array of memory cells.

26. A memory device, comprising:
a plurality of memory cells, the memory cells including a defective memory cell;
decode circuitry for receiving an address input provided to the memory device and selecting a plurality of memory cells including non-defective memory cells and the defective memory cell based upon the address input received;
a redundant storage cell capable of maintaining a data value;
redundant detection circuitry for comparing the address input with an address of the defective memory cell;
an external data port; and
circuitry coupled to the redundant storage cell for selectively and individually accessing the redundant storage cell based upon the comparison to replace the defective memory cell along with accessing of the addressed non-defective memory cells.

27. The memory device of claim 26, wherein the plurality of memory cells is a volatile memory device and the redundant storage cell is a latch circuit.

28. The memory device of claim 26, wherein the redundant storage cell includes at least one logic gate.

29. The memory device of claim 26, wherein the circuitry comprises a multiplexer circuit coupled between the redundant storage cell and the external data port and between the memory cells and the external data port.

30. The memory device of claim 26, further comprising:
second redundant detection circuitry for comparing the address input with a second address corresponding to a second defective memory cell in the plurality of memory cells; and
a second redundant storage cell capable of maintaining a data value, wherein the circuitry selectively and individually accesses the second redundant storage cell based upon the comparison by the second redundant detection circuitry to replace the second defective memory cell along with accessing of the addressed non-defective memory cells.

31. The memory device of claim 30, wherein the memory device includes first and second external data ports, and the redundant storage cell is coupled to the first external data port and the second redundant storage cell is coupled to the second external data port.

32. The memory device of claim 30, wherein the data circuitry includes a multiplexer coupled between the redundant storage cell and the external data port and between the second redundant storage cell and the external data port.

33. A memory device, comprising:
a plurality of memory cells, the memory cells including a defective memory cell;
decode circuitry for receiving an address input provided to the memory device and selecting a plurality of memory cells including non-defective memory cells and the defective memory cell;
a redundant storage cell, separate from the memory cells, capable of maintaining a data value;
redundant detection circuitry for comparing the address input with an address of the defective memory cell;
an external data port; and
means, coupled to the redundant storage cell, for selectively and individually replacing, during the course of a memory access operation, the defective memory cell with the redundant storage cell based upon the comparison while accessing the non-defective memory cells.

34. A memory device, comprising:

a memory array including a plurality of memory cells, at least one redundant memory cell; and a circuit that detects when an addressed one of the plurality of memory cells is defective and instead addresses, along with addressed non-defective memory cells in the memory array, the at least one redundant memory cell as a replacement for the defective memory cell.

35. A method for accessing a memory device including a memory array having a plurality of memory cells and at least one redundant memory cell, comprising:

detecting when an addressed one of the plurality of memory cells is defective; and addressing, along with addressed non-defective memory cells in the memory array, the at least one redundant memory cell as a replacement for the defective memory cell.

* * * * *